(12) United States Patent
de Buda

(10) Patent No.: US 8,493,053 B2
(45) Date of Patent: Jul. 23, 2013

(54) SYSTEM AND DEVICE FOR MEASURING VOLTAGE IN A CONDUCTOR

(75) Inventor: Eric George de Buda, Toronto (CA)

(73) Assignee: GRID20/20, Inc., Richmond, VA (US)

( * ) Notice: Subject to any disclaimer, the term of this patent is extended or adjusted under 35 U.S.C. 154(b) by 705 days.

(21) Appl. No.: 12/641,625

(22) Filed: Dec. 18, 2009

(65) Prior Publication Data

US 2011/0148393 A1    Jun. 23, 2011

(51) Int. Cl.
G01R 31/02    (2006.01)

(52) U.S. Cl.
USPC ........ 324/72; 324/157; 324/72.5; 324/117 H; 324/103 R; 324/126; 324/127; 324/128; 324/129

(58) Field of Classification Search
USPC ............... 324/72, 157, 72.5, 177 H, 103 R, 324/126–129, 117 H
See application file for complete search history.

(56) References Cited

U.S. PATENT DOCUMENTS

| | | | | |
|---|---|---|---|---|
| 2,362,372 A | * | 11/1944 | Halfmann | 324/115 |
| 4,071,819 A | * | 1/1978 | De Santis | 324/647 |
| 4,384,289 A | * | 5/1983 | Stillwell et al. | 340/870.17 |
| 4,529,931 A | * | 7/1985 | Kuhns | 324/117 R |
| 4,689,752 A | * | 8/1987 | Fernandes et al. | 700/292 |
| 4,709,339 A | * | 11/1987 | Fernandes | 700/293 |
| 4,714,893 A | * | 12/1987 | Smith-Vaniz et al. | 324/126 |
| 4,724,381 A | * | 2/1988 | Crimmins | 324/127 |
| 4,794,507 A | * | 12/1988 | Cavigelli | 363/86 |
| 4,795,973 A | * | 1/1989 | Smith-Vaniz et al. | 324/126 |
| 4,799,005 A | * | 1/1989 | Fernandes | 324/127 |
| 4,801,937 A | * | 1/1989 | Fernandes | 340/870.16 |
| 4,808,917 A | * | 2/1989 | Fernandes et al. | 324/127 |
| 4,823,075 A | * | 4/1989 | Alley | 324/117 H |
| 4,847,554 A | * | 7/1989 | Goodwin | 324/127 |
| 4,847,780 A | * | 7/1989 | Gilker et al. | 702/64 |
| 4,851,763 A | * | 7/1989 | Grutzmacher et al. | 324/127 |
| 4,904,996 A | * | 2/1990 | Fernandes | 340/870.07 |
| 5,130,635 A | * | 7/1992 | Kase | 323/280 |
| 5,254,953 A | * | 10/1993 | Crook et al. | 324/538 |
| 5,420,504 A | * | 5/1995 | Berkcan | 324/126 |
| 5,430,613 A | * | 7/1995 | Hastings et al. | 361/760 |
| 5,451,865 A | * | 9/1995 | Coburn | 324/127 |
| 5,473,244 A | * | 12/1995 | Libove et al. | 324/126 |
| 5,773,971 A | * | 6/1998 | Tavernetti | 324/67 |
| 5,896,028 A | * | 4/1999 | Arai | 324/117 H |
| 6,496,013 B1 | * | 12/2002 | Buks et al. | 324/538 |
| 6,549,120 B1 | * | 4/2003 | de Buda | 370/482 |
| 6,825,650 B1 | * | 11/2004 | McCormack et al. | 324/127 |
| 6,950,567 B2 | * | 9/2005 | Kline | 385/15 |

(Continued)

Primary Examiner — Patrick Assouad
Assistant Examiner — Lamarr Brown
(74) Attorney, Agent, or Firm — Ann I. Dennen; Lanier Ford Shaver & Payne, P.C.

(57) ABSTRACT

A system and device for measuring voltage in a conductor having a voltage provides a first electrode surrounding and spaced from the conductor, and a second electrode surrounding and spaced from both the conductor and the first electrode such that there is no contact between the conductor and the electrodes or between the first and second electrodes. The first electrode is connected to a first input of a differential amplifier circuit and the second electrode is connected to the other input of the differential amplifier circuit. The output of the differential amplifier circuit provides a voltage signal in proportion to the voltage of the conductor, thus providing a non-contact means for measuring the voltage of a conductor without requiring a connection to ground while simultaneously providing a high level of rejection of external interference.

23 Claims, 6 Drawing Sheets

U.S. PATENT DOCUMENTS

| | | | |
|---|---|---|---|
| 6,965,225 B2 * | 11/2005 | de Buda | 324/117 R |
| 7,102,478 B2 * | 9/2006 | Pridmore et al. | 336/176 |
| 7,208,963 B2 * | 4/2007 | Schrom et al. | 324/713 |
| 7,265,533 B2 * | 9/2007 | Lightbody et al. | 324/126 |
| 7,321,227 B2 * | 1/2008 | Fritsch et al. | 324/142 |
| 7,336,202 B2 * | 2/2008 | Kawai et al. | 340/870.17 |
| 7,371,354 B2 * | 5/2008 | Lau | 422/186.04 |
| 7,397,233 B2 * | 7/2008 | Sorensen | 324/76.11 |
| 7,557,563 B2 * | 7/2009 | Gunn et al. | 324/127 |
| 7,755,347 B1 * | 7/2010 | Cullen et al. | 324/117 H |
| 7,821,252 B2 * | 10/2010 | Lepine et al. | 324/117 H |
| 7,940,039 B2 * | 5/2011 | de Buda | 324/103 R |
| 8,198,885 B2 * | 6/2012 | Sorensen | 324/126 |
| 2004/0080307 A1 * | 4/2004 | Ohtsuka | 324/117 H |
| 2005/0275397 A1 * | 12/2005 | Lightbody et al. | 324/126 |
| 2006/0215334 A1 * | 9/2006 | Hong et al. | 361/15 |
| 2008/0061764 A1 * | 3/2008 | Tae et al. | 324/72 |
| 2008/0093931 A1 * | 4/2008 | Yoshida | 307/80 |
| 2009/0128132 A1 * | 5/2009 | Wappis et al. | 324/123 R |
| 2010/0085036 A1 * | 4/2010 | Banting et al. | 324/127 |
| 2011/0260711 A1 * | 10/2011 | Badegruber et al. | 324/127 |
| 2012/0176121 A1 * | 7/2012 | Earp et al. | 324/126 |

* cited by examiner

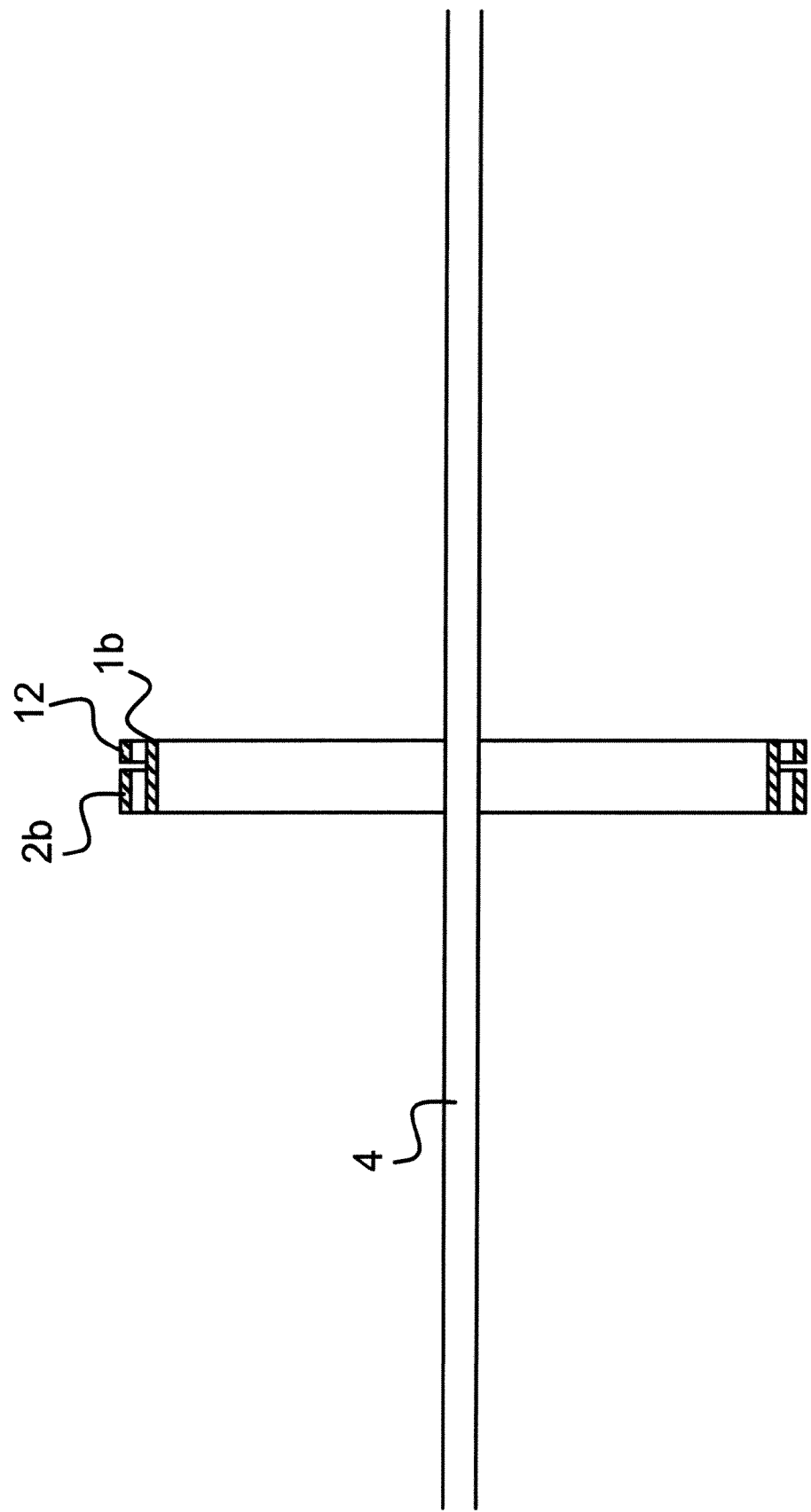

SYSTEM AND DEVICE FOR MEASURING VOLTAGE IN A CONDUCTOR

FIELD OF THE INVENTION

This invention relates generally to electric energy distribution systems. More specifically, the invention relates to a system and device for measuring the voltage of a conductor in situations where a connection to ground, or other known voltage, may be unsafe, impractical, or undesirable for other reasons. In one embodiment, the system of the invention may be used in a line-mounted device for measuring the voltage, and thus determining electrical parameters such as energy, the power factor, or the accumulated in-phase current in a distribution feeder.

BACKGROUND OF THE INVENTION

In U.S. Pat. No. 6,549,120 issued Apr. 15, 2003 to de Buda, "Device for sending and receiving data through power distribution transformers," which is incorporated herein by reference, the idea of a line-mounted power line monitor which collects data on power flow in an electrical distribution feeder is presented. In order for such a power line monitor to be able to measure energy and power it must be able to accurately measure both voltage and current. There are numerous examples in the state of the art of current sensors which would be suitable; one example being the sensor described in U.S. Pat. No. 6,965,225 issued Nov. 15, 2005 to de Buda, "Coreless current sensor," which is incorporated herein by reference.

However, development of such a line-mounted power line monitor has been impeded by the lack of a suitable voltage sensor. While there are many examples of voltage sensor technology available, the vast majority of them require connection either to earth-ground or to a known voltage. This requirement presents a serious problem for the line-mounted power line monitor for two reasons. Firstly, distribution feeders operate at high voltages (1,200 to 44,000 volts) and can deliver very high energy levels. Should there be a short circuit in a device that is connected between earth-ground and the feeder conductor, a powerful explosion could easily result, making the installation of any such device very hazardous to utility workers. Secondly, the geometry of the pole configuration may prevent safe access to earth-ground for such a device. An example of this would be the mounting of all three phases of a three-phase feeder on poles without cross-arms, so that the phases are mounted at different vertical levels on the pole.

In U.S. Pat. No. 4,689,752 issued Aug. 25, 1987, which is incorporated herein by reference, Roosevelt A. Fernandes and William R. Smith-Vaniz present a voltage sensor which does not need a connection either to earth-ground or to a reference voltage. This patent describes a line-mounted power line monitor with an energy and power measurement capability using this particular voltage sensor. It is apparent, however, that this device was developed for transmission lines rather than distribution feeders and does not have the ability to minimize interference from adjacent energized conductors. Transmission lines operate at higher voltages (115 kV to 765 kV) and therefore are spaced farther apart (10 to 50 ft). As a result the amount of interference from nearby energized conductors is likely to be smaller than in the case of distribution feeders.

Furthermore, with transmission lines, voltage sensors can be legitimately calibrated in-situ to calibrate out the effect of the other two phases because if one phase is lost, the other two are shut down as well. In distribution feeder lines where the voltage can be as low as 2.4 kV, the spacing might be only two feet, making the interference from adjacent conductors a more serious source of error. It would not be valid to calibrate out this error because in distribution feeder lines if one phase is lost, the other two phases would not necessarily be shut down. This is significant because the loss of one phase would render the in-situ calibration invalid and result in significant error. Thus while the device presented by Roosevelt A. Fernandes and William R. Smith-Vaniz may be suitable for transmission lines, it would not always be suitable for use on distribution feeder lines, which are often close to other energized conductors having other voltage phases as is commonly the case with three-phase feeders, if accuracy is important.

In Japanese patent application no. 2002-131341 published May 9, 2002, Nakai Yuji presents a non-contact voltage sensor consisting of a cylindrical sensing electrode surrounding the conductor whose voltage is to be measured, with a larger shielding electrode surrounding it to reduce interference. This device presents some of the disadvantages referenced above, since the associated electronic instrumentation requires a connection to earth-ground.

In U.S. Pat. No. 7,397,233 issued Jul. 8, 2008, which is incorporated herein by reference, Thomas Sorensen presents a non-contact voltage sensor which has features for reducing external interference. This sensor is based on one set of directional sensors facing toward the conductor whose voltage is to be measured and another set of directional sensors facing away from it. The directionality of these sensors depends on shielding electrodes which are larger than the sensing electrodes. These shielding electrodes are all connected to a common reference conductor which also serves as the voltage reference for the associated electronic instrumentation. One would normally expect the highest level of noise immunity for such a system to be achieved if such a reference conductor were connected to earth-ground, however, Sorenson proposes that the reference conductor be left floating such that it is tied to earth-ground only through stray capacitance. Since such a reference conductor will also have stray capacitance to nearby energized conductors, this creates a potential path for external interference to enter the circuit and produce error. Sorenson indicates for this sensor that the interference pickup is a factor of seven or more less than levels recorded when using the measuring device of his FIG. 2 which is acknowledged to suffer from interference from external fields and is therefore not usable in many applications for accurate power factor and quality measurements. Sorenson also acknowledges that with his sensor it is necessary to know the value of the stray capacitances to the sensor electrodes in order to accurately predict the amplitude of the voltage of the conductor whose voltage is to be measured and instead proposes that the sensor be used for power factor and power quality measurement where the absolute value of the voltage is not necessarily required.

For accurate energy and power measurement the absolute value of the voltage is required and in fact must be determined quite accurately. Thus it is necessary for the voltage sensor to have a very high level of rejection for external interference, without being dependent on stray capacitances which can change due to weather conditions.

There is therefore a need for an accurate voltage sensor which does not need a connection either to earth-ground or to a reference voltage, and which would be suitable for use in a line-mounted power line monitor which must be able to measure energy and power accurately even in the presence of nearby energized conductors.

BRIEF DESCRIPTION OF THE DRAWINGS

FIG. 6 is a cross-sectional elevational view of an alternative embodiment of the present invention.

DETAILED DESCRIPTION OF THE INVENTION

Figure 1:
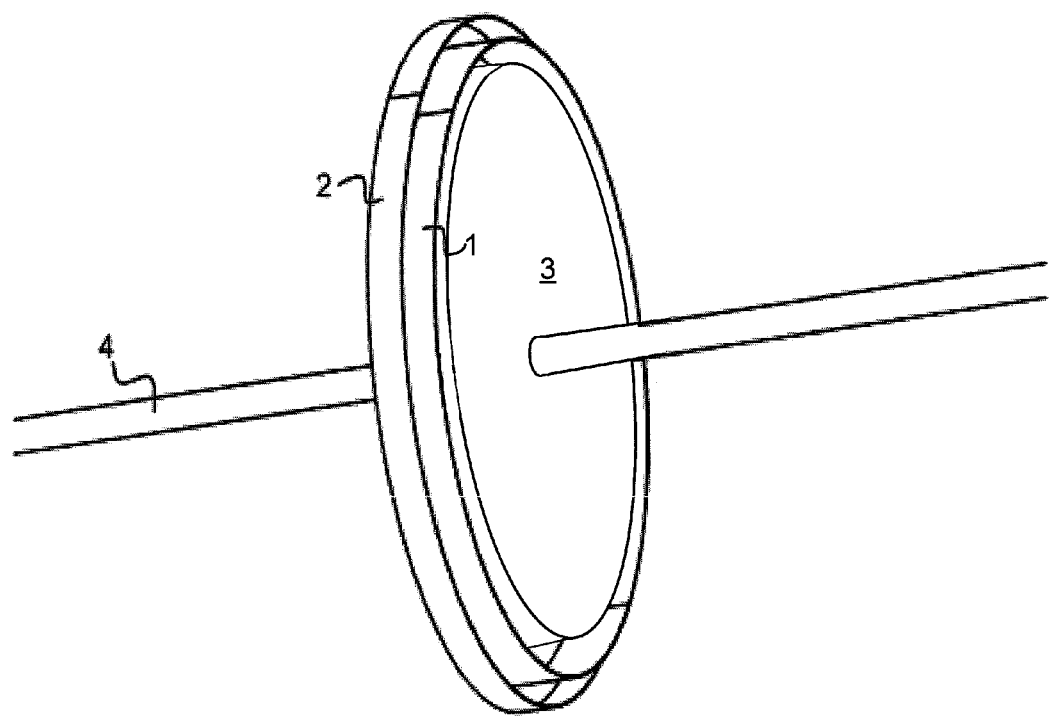
FIG. 1 is a perspective of the voltage sensor electrodes surrounding a conductor.

The system and device of the present invention derive a measure of voltage from the electrostatic field surrounding a conductor. A conductor having the same voltage as earth-ground will not have a measureable electrostatic field surrounding it. If the conductor has a voltage different than earth-ground, it will have an electric charge which produces a non-uniform field surrounding it. This field will have greater intensity closer to the conductor and lower intensity farther away. An electrode closer to the conductor will pick up more charge than an equivalent electrode farther away, and the difference in charge pickup will be greater for higher voltages on the conductor with respect to earth-ground than for lower voltages with respect to earth-ground. Thus, by measuring the difference in charge pickup between two different electrodes at different distances from the conductor, one can derive a measure of the voltage with respect to earth-ground without requiring any actual connection to earth-ground.

One potential problem with this approach is that such electrodes will also pick up charge from other nearby conductors in accordance with their voltages and this can then become a source of error. This is true even for the system and device of the present invention; however, the system and device of the present invention include an electrode geometry which is designed to collect equal amounts of charge from all other conductors, regardless of their voltage or distance from the electrodes, while simultaneously collecting different amounts of charge from the target conductor.

The present invention thus provides a device for measuring voltage in a target conductor having a voltage, comprising a first electrode surrounding and spaced from the target conductor, a second electrode surrounding and spaced from the first electrode, and a differential amplifier circuit, the first electrode being connected to a first of two inputs of the differential amplifier circuit and the second electrode being connected to a second of the two inputs of the differential amplifier circuit, the output of the differential amplifier circuit providing a voltage signal in proportion to the voltage of the target conductor.

In other embodiments, the first and second electrodes are substantially circular; the first and second electrodes are substantially concentric with the target conductor; the first and second electrodes are oriented substantially radially relative to the target conductor; the first and second electrodes are substantially coaxial with the target conductor; the first electrode is wider than the second electrode in an axial direction; a width of the first electrode is selected to collect a substantially equal amount of charge from an external interfering voltage source as collected by the second electrode; the differential amplifier circuit includes a circuit for equalizing the phase response of the electrodes; the electrodes are split into two or more portions; a third electrode is electrically connected to the first electrode, the third electrode having a diameter and an axial width selected such that phase responses of the first and third electrodes are matched to a phase response of the second electrode; and/or the three electrodes are each split into two or more portions.

Referring to FIG. 1, a target conductor 4 (i.e. the conductor in which electrical parameters are to be measured) is surrounded by first and second electrodes 1, 2 having different diameters and different widths. In one embodiment, an insulator 3 is postioned between the electrode 1 and the conductor 4. The electrodes 1, 2 are preferably substantially cylindrical and substantially concentric with the target conductor 4, and preferably coaxial with the target conductor 4. The inner electrode 1 is preferably wider than the outer electrode 2. The electrodes 1, 2 are spaced from the conductor 4 and spaced from each other such that there is no electrically conductive contact between the conductor 4 and the electrodes 1, 2 or between the first and second electrodes 1 and 2.

To allow for installation onto an existing conductor without requiring that the conductor be disconnected and strung through the sensor, in one embodiment of the device both electrodes 1, 2 are preferably split into two portions. Electrode portion 1a has the same radius and width as electrode portion 1b, and together these electrode portions are electrically coupled to form electrode 1. Likewise, electrode portions 2a and 2b have the same radius and width and are electrically coupled to form electrode 2. This split sensor embodiment allows for installation onto an existing conductor 4 without requiring that the conductor 4 be disconnected and strung through the sensor. It may be advantageous from a manufacturing standpoint to make the portions 1a, 1b of electrode 1 identical half-electrodes, and to make the portions 2a, 2b of electrode 2 identical half-electrodes.

Figure 2:
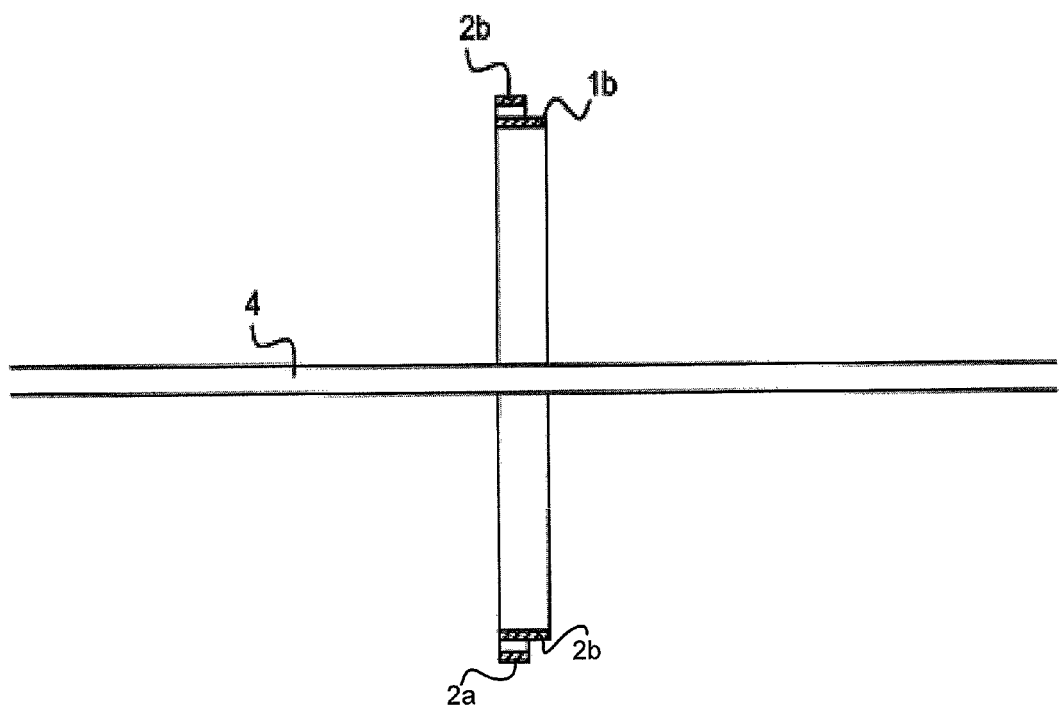
FIG. 2 is a cross-sectional elevational view of the voltage sensor electrodes surrounding a conductor.

Referring to FIG. 2, the left-hand edges of electrodes 1 and 2 are lined up in the embodiment shown, however, in certain instances, it may be beneficial to introduce a small distance offset between the edges of the two electrodes 1, 2 for optimization purposes.

Figure 3:
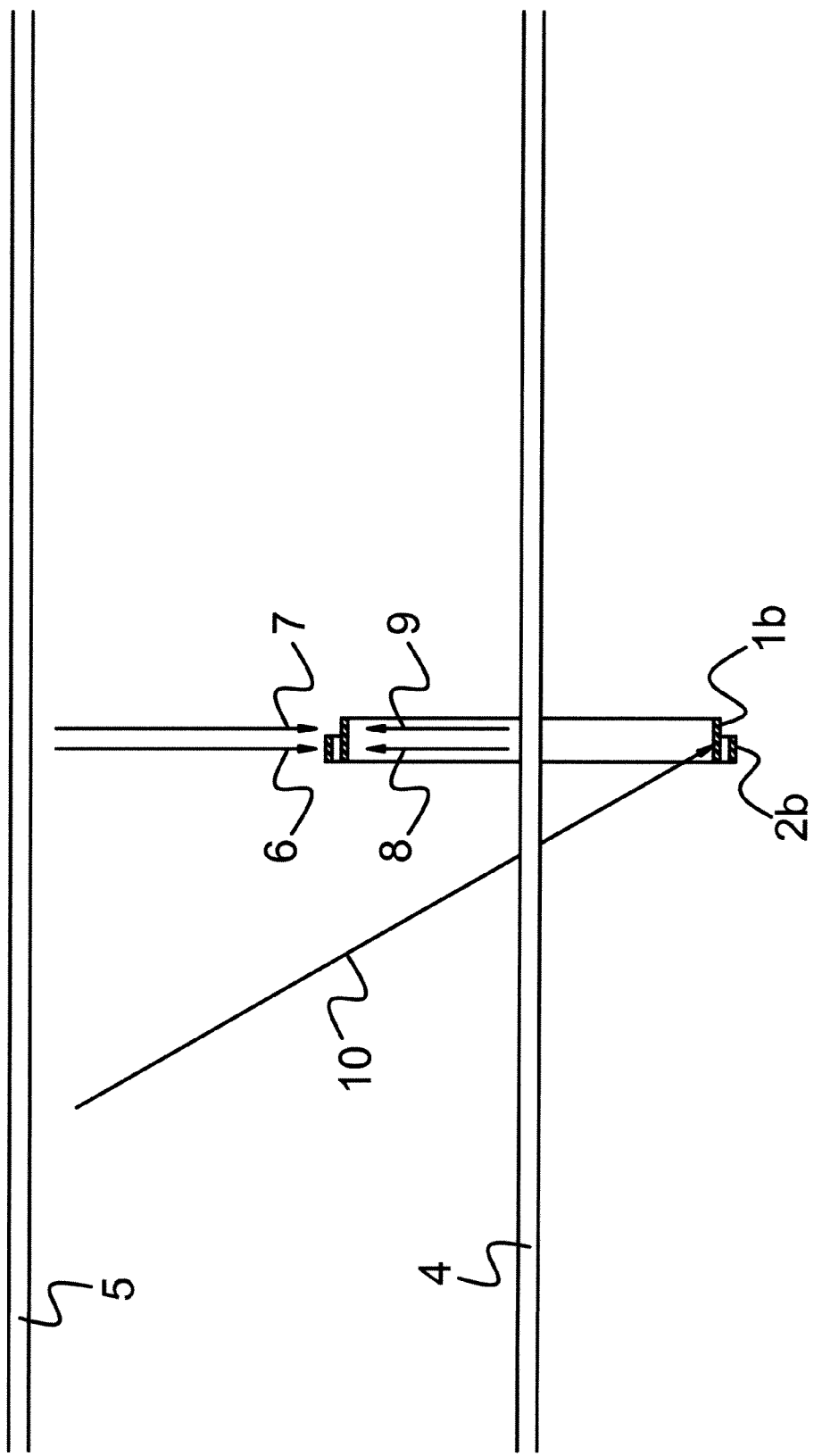
FIG. 3 is a cross-sectional elevational view of the voltage sensor electrodes surrounding a conductor in the presence of another conductor.

Referring to FIG. 3, the target conductor 4 is surrounded by electrodes 1 and 2. A second conductor 5 is present as a potential source of signal interference. The electric field from target conductor 4 approaching electrodes 1 and 2 along vectors 8 and 9 will preferentially induce an electric charge onto electrode 1 over electrode 2 because of the larger width of electrode 1, the shorter distance from the target conductor 4 to electrode 1, and the shadowing effect of electrode 1 on electrode 2 since the electrostatic field along vector 8 and 9 will contact inner electrode 1 before it contacts outer electrode 2.

In the case of the electrostatic field from the second conductor 5 approaching electrodes 1 and 2 along vector 6, the shadowing effect is reversed since the second conductor electrostatic field contacts electrode 2 before it contacts electrode 1. Thus, the electrostatic field along vector 6 will preferentially induce an electric charge onto electrode 2 over electrode 1. The portion of the second conductor electrostatic field approaching electrode 1 along vector 7 will bypass electrode 2 and therefore will preferentially induce an electric charge onto electrode 1 instead of electrode 2. Thus, the effect of the second conductor electrostatic field from second conductor 5 along vector 6 will oppose the effect of the electrostatic field from conductor 5 along vector 7.

However, vectors 6 and 7 are not the only paths for interference from second conductor 5. Vector 10 is one example of a path which will result in charge being preferentially induced onto first electrode 1 over second electrode 2. There are many other such paths for interference. The need to eliminate the interference from second conductor 5 requires that both first electrode 1 and second electrode 2 receive the same amount of charge from the electrostatic field emanating from second conductor 5. This condition can be achieved when second electrode 2 is wider than half of the width of first electrode 1, but narrower than the width of first electrode 1. It has been determined empirically that an effective ratio for the width of second electrode 2 relative to first electrode 1 is close to 3:5 for a second electrode 2 diameter of approximately 5.125 inches, a first electrode 1 diameter of approximately 4.7 inches and a width of first electrode 1 of approximately 0.5 inches.

Figure 4:
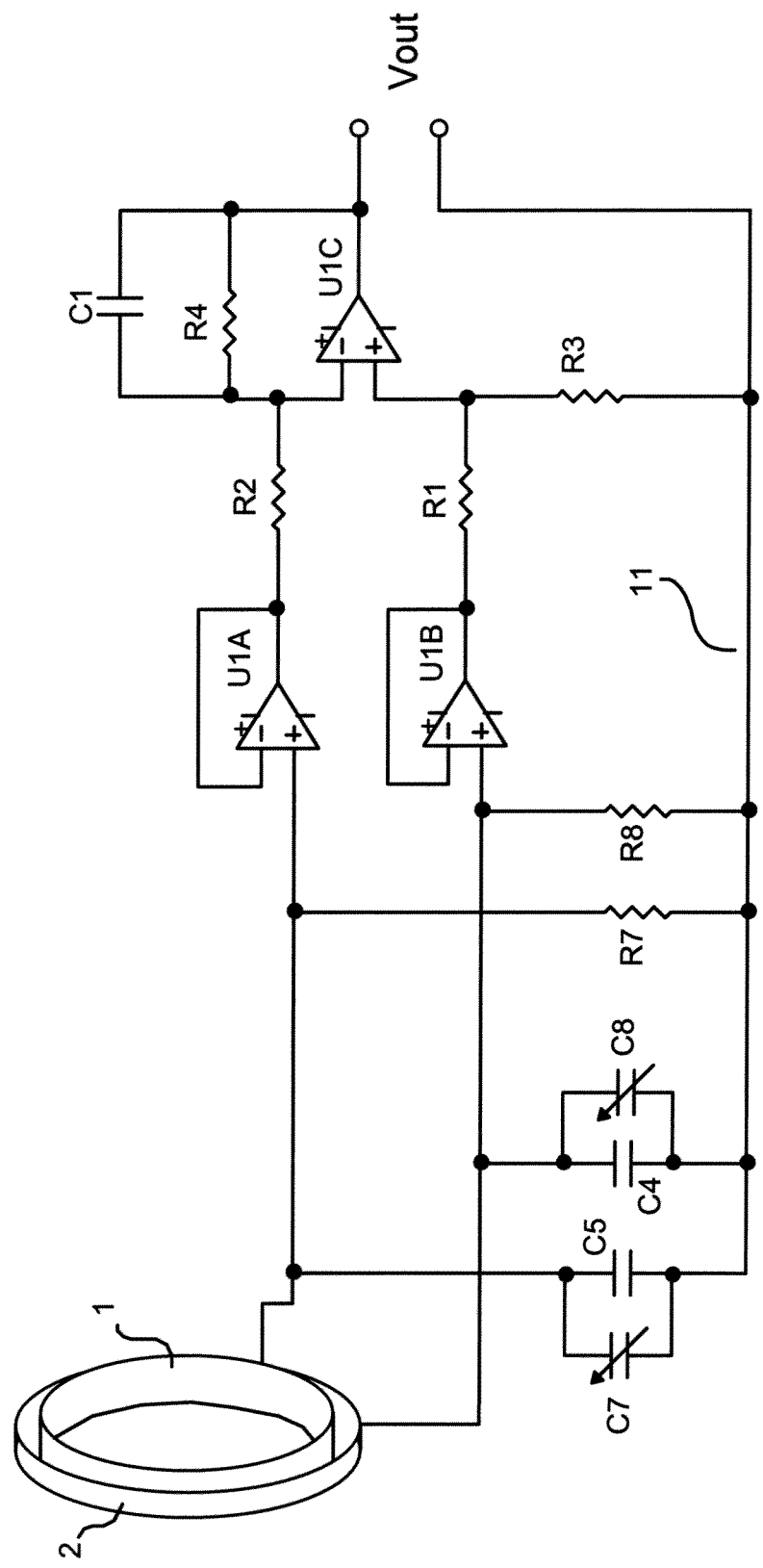
FIG. 4 is a circuit diagram of the electronic instrumentation for a sensor according to the invention.

A power line monitor 20 according to the invention comprises circuitry suitable for processing the electrical signals from the electrodes 1, 2. Referring to FIG. 4, an example of a differential amplifier circuit suitable for processing the electrical signals from the electrodes 1, 2 is shown. Since the electrodes 1 and 2 have very low capacitance to other nearby conductors, their signal output has a very high impedance. To effectively collect their signals, they are connected to high impedance inputs on amplifiers U1A and U1B. High impedance resistors R7 and R8 are connected between the electrodes 1, 2 and the circuit common 11, to prevent the voltage inputs from drifting out of range. Capacitors C4 and C5 interact with the electrode capacitance to produce capacitive dividers, which enable the sensor to sense thousands of Volts without the input signal exceeding the amplifier input ranges of amplifiers U1A and U1B. Variable capacitors C7 and C8 are adjusted to compensate for tolerance variations in capacitors C4 and C5 to preserve a very high common mode rejection ratio, which is advantageous for eliminating interference from nearby energized conductors.

A differential amplifier comprising amplifier U1C and resistors R1, R2, R3, and R4 amplifies the difference in signal level from U1A and U1B to produce an output signal Vout which is proportional to the voltage of the target conductor 4 (not shown in FIG. 4) without being significantly affected by interference from nearby energized conductors 5. The circuit common 11 is not connected to any shielding and can therefore be connected directly to the target conductor 4 or can be allowed to float. Alternatively, if the target conductor 4 is insulated, circuit common 11 can be connected to a capacitive coupling sleeve surrounding target conductor 4 and having substantially greater capacitance to target conductor 4 than to either electrode 1 or electrode 2.

Since inner electrode 1 has a smaller diameter than outer electrode 2, it also may have a slightly faster frequency response. If this is not compensated for, then a small amount of noise can still enter the signal even when the amplitude responses of both electrodes 1 and 2 are exactly equal. Capacitor C1 may be added in feedback to amplifier U1C to compensate for the slight phase rotation to completely cancel out the external interference at 60 Hz. This phase compensation should only need to be very small if the instrumentation is correctly designed. If C1 is too large, it may not be suitable in situations where the distribution feeder line has a very high level of harmonic voltage since the harmonic frequencies would not be shifted by the correct amount. If necessary, the phase rotation effect can also be reduced by reducing the difference between the diameters of the inner and outer electrodes 1, 2.

While it is very beneficial for the inner electrode 1 to be wider than the outer electrode 2, it is possible for the sensor to work if inner electrode 1 is the same width as outer electrode 2 or even narrower than electrode 2, however, in such cases, it would be necessary for the differential amplifier inputs to have different gains to compensate for this. A differential amplifier having different gains for its two inputs would not be as effective in eliminating common mode noise as a true differential amplifier where both inputs have equal (but opposite) gains and thus the sensor would not be as accurate.

Referring to FIG. 6, another approach to phase compensation would be to add a third electrode 12 which is electrically connected to inner electrode 1 but which has a larger diameter. By adjusting the widths, diameters and axial locations of the three electrodes, it should be possible to achieve perfect phase cancellation as well as amplitude cancellation of voltage sources outside of the electrode rings for a wide range of distances.

Figure 5:
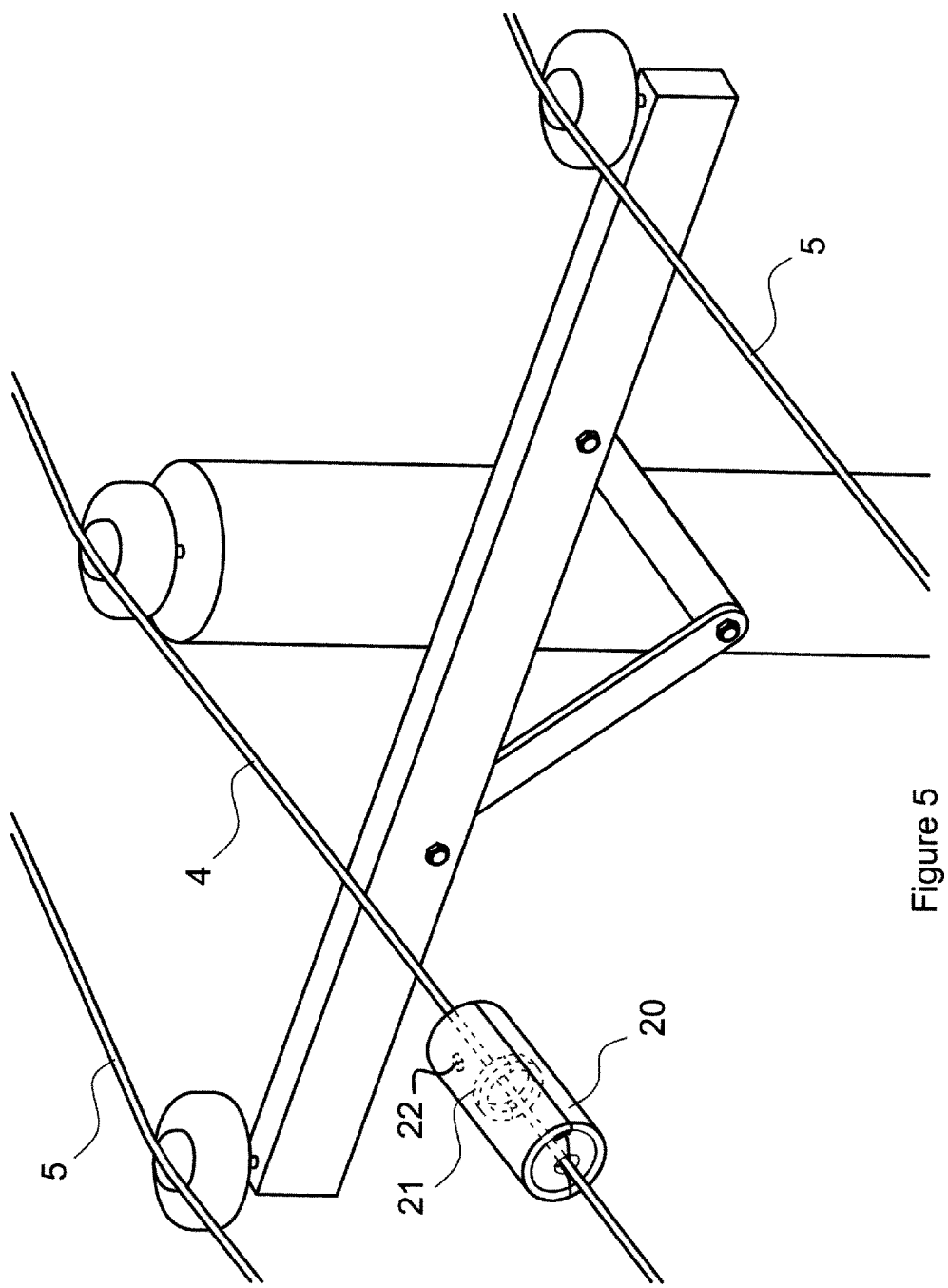
FIG. 5 is a perspective view of a line-mounted power line monitor showing the sensor electrodes in phantom.

Referring to FIG. 5, a power line monitor 20 is shown which incorporates a device of the present invention. The power line monitor 20 preferably comprises two portions (for example, halves) of a housing formed from any suitable dielectric material, joined by a hinge (not shown) which allows the monitor 20 to be closed around the target conductor 4 (a distribution feeder line as illustrated). One portion of the power line monitor 20 contains one electrode portion 1a, 2a of each electrode 1, 2, respectively, while the other portion of the power line monitor 20 contains the other electrode portion 1b, 2b of each electrode 1, 2, respectively. When the power line monitor 20 is mounted, the voltage sensor electrode assembly 21 surrounds the target conductor 4 and enables the voltage to be measured in the target conductor 4. Since the voltage sensor instrumentation 22 produces an analog of the actual AC waveform in the target conductor 4, it enables the power line monitor 20 to provide measurements of voltage, from which such parameters as power factor, power (kW), energy (kWh) and accumulated in-phase current (AIPC) can be derived with a high level of accuracy.

The invention claimed is:

1. A device for measuring voltage in a target conductor having a voltage, comprising:
    a first electrode surrounding and spaced from the target conductor;
    a second electrode surrounding and spaced from the first electrode; and
    a differential amplifier circuit, the first electrode being connected to an input of a first amplifier of the differential amplifier circuit and the second electrode being connected to an input of a second amplifier of the differential amplifier circuit, the output of the differential amplifier circuit providing a voltage signal in proportion to the voltage of the target conductor.

2. The device according to claim 1 wherein the first and second electrodes are substantially circular.

3. The device according to claim 1 wherein the first and second electrodes are substantially concentric with the target conductor.

4. The device according to claim 1 wherein the first and second electrodes are oriented substantially radially relative to the target conductor.

5. The device according to claim 2 wherein the first and second electrodes are substantially concentric with the target conductor.

6. The device according to claim 2 wherein the first and second electrodes are oriented substantially radially relative to the target conductor.

7. The device according to claim 1 wherein the first and second electrodes are substantially coaxial with the target conductor.

8. The device according to claim 7 wherein the first and second electrodes are substantially circular.

9. The device according to claim 8 wherein the first electrode is wider than the second electrode in an axial direction.

10. The device according to claim 9 wherein a width of the first electrode is selected to collect a substantially equal amount of charge from an external interfering voltage source as collected by the second electrode.

11. The device according to claim 8 wherein the differential amplifier circuit includes a circuit for equalizing the phase response of the electrodes.

12. The device according to claim 8 wherein the electrodes are split into two or more portions.

13. The device according to claim 8 wherein a third electrode is electrically connected to the first electrode, the third electrode having a diameter and an axial width selected such that phase responses of the first and third electrodes are matched to a phase response of the second electrode.

14. The device according to claim 13 wherein the three electrodes are each split into two or more portions.

15. A power line monitor comprising the device of claim 1.

16. A power line monitor comprising the device of claim 2.

17. A power line monitor comprising the device of claim 3.

18. A power line monitor comprising the device of claim 4.

19. A power line monitor comprising the device of claim 5.

20. A power line monitor comprising the device of claim 6.

21. The device of claim 1, wherein the first electrode is spaced a shorter distance from the target conductor than the second electrode.

22. The device of claim 21, wherein the first electrode has a width that is different than a width of the second electrode.

23. The device of claim 22, wherein the width of the second electrode is wider than half of the width of first electrode.

* * * * *